(12) United States Patent
Wong et al.

(10) Patent No.: US 8,416,845 B1
(45) Date of Patent: Apr. 9, 2013

(54) DECISION FEEDBACK EQUALIZATION FOR VARIABLE INPUT AMPLITUDE

(75) Inventors: Wilson Wong, San Francisco, CA (US);
Sergey Yuryevich Shumarayev, San Leandro, CA (US); Rakesh Patel, Cupertino, CA (US); Tim Tri Hoang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 1603 days.

(21) Appl. No.: 11/484,285

(22) Filed: Jul. 11, 2006

(51) Int. Cl.
*H03H 7/30* (2006.01)
*H03H 7/40* (2006.01)
*H03K 5/159* (2006.01)

(52) U.S. Cl.
USPC .......................................................... 375/233

(58) Field of Classification Search .................. 375/233, 375/232, 230, 229, 236, 219, 222, 261, 346, 375/348, 350, 355
See application file for complete search history.

(56) References Cited

U.S. PATENT DOCUMENTS

| | | | | |
|---|---|---|---|---|
| 5,598,433 A | * | 1/1997 | Kaku et al. | 375/230 |
| 6,002,713 A | * | 12/1999 | Goldstein et al. | 375/222 |
| 6,052,412 A | * | 4/2000 | Ruether et al. | 375/231 |
| 6,438,360 B1 | * | 8/2002 | Alberth et al. | 455/110 |
| 2003/0001684 A1 | * | 1/2003 | Magoon et al. | 331/182 |
| 2003/0053534 A1 | * | 3/2003 | Sivadas et al. | 375/229 |
| 2004/0005001 A1 | * | 1/2004 | Jones et al. | 375/232 |
| 2004/0066321 A1 | * | 4/2004 | Brooks | 341/143 |
| 2004/0172148 A1 | * | 9/2004 | Horibe | 700/94 |
| 2004/0196897 A1 | * | 10/2004 | Tan et al. | 375/233 |
| 2005/0259767 A1 | * | 11/2005 | Garmany et al. | 375/343 |
| 2006/0088056 A1 | * | 4/2006 | Quigley et al. | 370/468 |
| 2006/0142999 A1 | * | 6/2006 | Takada et al. | 704/205 |
| 2006/0170581 A1 | * | 8/2006 | Lin | 341/155 |

OTHER PUBLICATIONS

Altera Corporation, "Using Pre-Emphasis and Equalization with Stratix GX White Paper," Altera Corporation White Paper, pp. 1-11, Sep. 2003, Version 1.0.

* cited by examiner

*Primary Examiner* — David C. Payne
*Assistant Examiner* — Syed Haider
(74) *Attorney, Agent, or Firm* — Ropes & Gray LLP

(57) ABSTRACT

Methods and circuits for automatic adjustment of equalization are presented that improve the quality of equalization for input signals with varying amplitudes. The methods and circuits may be used in Decision Feedback Equalization (DFE) circuits to maintain a constant equalization boost amplitude despite variations in input signal amplitude. The equalization circuitry measures the amplitude of the equalization input signal and computes tap coefficients to maintain a desired level of boost amplitude. Tap coefficients may be automatically adjusted by the equalization circuitry.

22 Claims, 5 Drawing Sheets

DECISION FEEDBACK EQUALIZATION FOR VARIABLE INPUT AMPLITUDE

BACKGROUND OF THE INVENTION

This invention relates to equalization methods and circuits for data communication. Methods and circuits are presented that improve the quality of equalization for input signals with varying amplitudes.

Equalization circuits are used to process received signals to improve the quality of the received signals. Equalization circuits compensate for the attenuation, delay and distortion suffered by the received signal during transmission. In some applications such as high-speed communications, high quality equalization is required in order to support high-speed and high-accuracy transmission of data signals. In order to increase the quality of equalization, equalization circuits may be designed to compensate for the particular characteristics of the attenuation, delay, and distortion caused by the combination of transmitter circuitry, transmission link, and receiver circuitry used. Equalization circuits may also be optimized to function with particular transmission protocols.

In applications in which equalization circuits may be used with various transmitter circuits, transmission links, receiver circuits, and/or transmission protocols, it may not be possible to design the equalization circuits to provide optimal signal equalization for use with all combinations of circuits and links. Adjustable equalization circuits may be used in such situations, and may allow users to adjust the characteristics of the equalizer to provide improved signal equalization. However, the use of adjustable equalization circuits may require complex and time consuming equalization adjustment procedures prior to signal transmission. In addition, the adjustment process may need to be repeated if characteristics of the transmission attenuation, delay, or distortion change. Adjustable equalization circuits may therefore not be well suited for use in certain situations.

Methods and circuits for automatic adjustment of equalization may provide optimized signal equalization despite changes in transmitter, transmission link and receiver distortion. Automatic adjustment of equalization may additionally provide dynamic equalization adjustment to compensate for changes in distortion occurring during signal transmission.

SUMMARY OF THE INVENTION

Methods and circuits for automatic adjustment of equalization are presented that improve the quality of equalization for input signals with varying amplitudes. The methods and circuits may be used in Decision Feedback Equalization (DFE) circuits to maintain a constant equalization boost amplitude despite variations in input signal amplitude.

An illustrative decision feedback equalizer in accordance with the invention includes circuitry to (1) detect a low frequency amplitude of an input to the decision feedback equalizer and (2) maintain a desired ratio between the low frequency amplitude of the input and at least one tap coefficient of the decision feedback equalizer.

Equalization circuits may produce output signals based on weighted sums of an equalization input signal, an equalization output signal, and delayed versions of these input and output signals. The coefficients of the weighted sum, generally referred to as tap coefficients, may be chosen and adjusted to provide signal equalization with particular characteristics. For example, the coefficients of the weighted sum may be chosen to provide equalization with a particular equalization boost amplitude and/or a particular equalization frequency response. However, the equalization provided may also be influenced by factors other than the tap coefficients. These additional factors may affect the characteristics of the equalization provided, and may frustrate attempts to adjust or optimize equalization characteristics. In DFE circuits, for example, variations in the input signal amplitude may affect the amplitude of the equalization boost provided by the equalizer.

In order to maintain a constant equalization boost amplitude, it may therefore be desirable to adjust equalization tap coefficients to maintain the desired level of boost amplitude. The input signal amplitude may be measured or estimated using amplitude detection methods. Amplitude detection methods may rely on rectification and/or low pass filtering of the input signal. Processing circuitry may adjust the level of or compute new tap coefficients based on the input signal amplitude. The processing circuitry may include analog circuitry operative to adjust the tap coefficients proportionally to, or inversely proportionally to, the input signal amplitude and/or the other tap coefficients. The processing circuitry may include digital processing circuitry operative to compute new tap coefficients. Other types of processing circuitry are also envisioned.

Further features of the invention, its nature and various advantages, will be more apparent from the accompanying drawings and the following detailed description.

DETAILED DESCRIPTION

Methods and circuits for automatic adjustment of equalization may be used to provide uniform equalization despite variations in input signal amplitude. The amplitude of the input signal to an equalization circuit may vary due to changes in transmitter driver amplitude, transmission protocol, transmission distance, transmission links, receiver circuitry, as well as other factors. Variations in the amplitude of the input signal may affect the characteristics of the equalization provided by an equalizer, and may reduce the quality of the equalization. The quality of the equalization provided by DFE circuits may be especially diminished by variations in the input signal amplitude.

Figure 1:
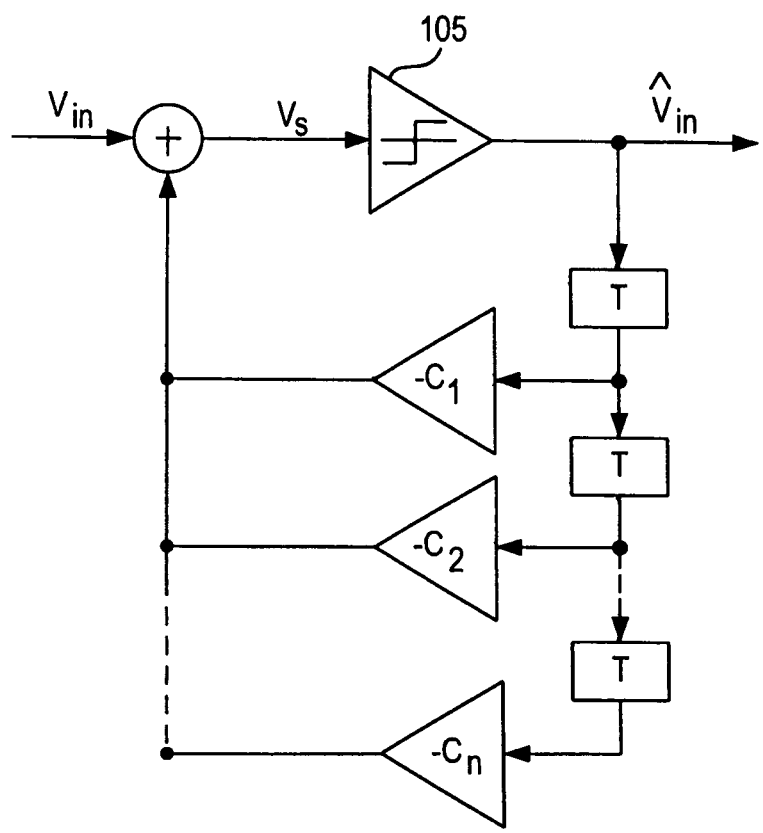
FIG. 1 shows a schematic diagram of a DFE equalizer of the prior art.

FIG. 1 shows a schematic diagram of a DFE circuit 100 of the prior art. DFE circuit 100 receives an analog input signal $V_{in}$ at its input, and produces an output signal corresponding to an estimate $\hat{V}_{in}$ of the input signal. The estimate $\hat{V}_{in}$ depends on the current value of the input signal $V_{in}$ and on past values of the estimate $\hat{V}_{in}[t-nT]$. $\hat{V}_{in}$ is a digital signal produced at the output of quantizer 105. Quantizer 105 determines whether the signal $V_s$ at the quantizer's input corresponds to a logic HIGH or a logic LOW signal. The signal $V_s$ at the input of the quantizer is equal to the weighted sum of the input signal $V_{in}$ and of time-delayed samples of the estimate $\hat{V}_{in}$. In the embodiment shown in FIG. 1, the signal Vs equals:

$$V_s = V_{in} - c_1 \times \hat{V}_{in}[t-T] - c_2 \times \hat{V}_{in}[t-2T] \ldots - c_n \times \hat{V}_{in}[t-nT] \quad (1)$$

The coefficients $c_1$-$c_n$ of the weighted sum, referred to as tap coefficients, determine the characteristics of the equalization produced by DFE equalizer 100. The coefficients may be selected to produce a particular DFE frequency response or a particular equalization boost amplitude, for example.

Quantizer 105 may be a continuous-time quantizer or a discrete-time quantizer. If quantizer 105 is a discrete-time quantizer, DFE circuit 100 may be a digital DFE circuit. Note that while equation (1) includes time-delayed versions of the estimate $\hat{V}_{in}$ that are equally spaced by time T, unequally-spaced or fractionally spaced versions of the estimate may also be used. The time-delayed versions of the estimate $\hat{V}_{in}$ may be continuous time signals or discrete-time samples of the estimate.

Figure 2:
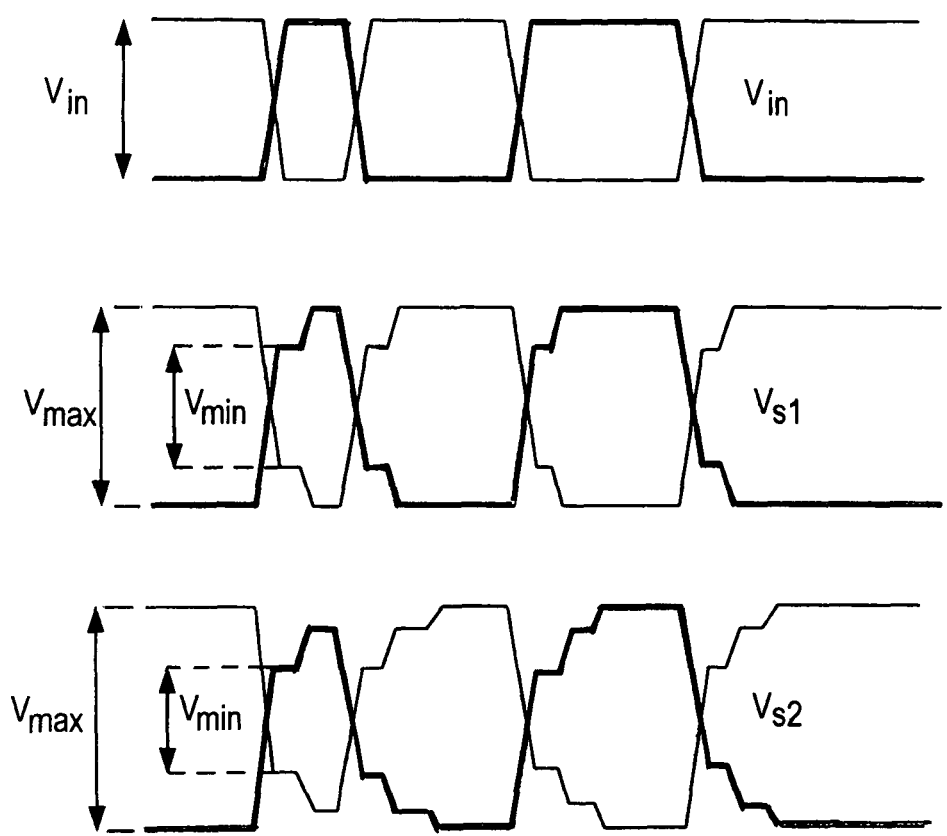
FIG. 2 shows an input and two illustrative output signals from a DFE equalizer.

FIG. 2 show an illustrative equalization input signal waveform $V_{in}$, and two intermediate waveforms $V_{s1}$ and $V_{s2}$ produced by DFE circuit such as circuit 100 in response to the $V_{in}$ signal. The $V_{s1}$ waveform may have been produced by a single-tap DFE circuit with a tap coefficient $c_1$ equal to $c_1$=−0.25. The $V_{s2}$ waveform may have been produced by a two-tap DFE circuit with two tap coefficients $c_1$ and $c_2$ equal to $c_1$=−0.25 and $c_2$=−0.125. The amplitude of the input signal $V_{in}$ and the maximum $V_{max}$ and minimum $V_{min}$ amplitudes of the intermediate $V_s$ signals are indicated on the waveforms of FIG. 2.

The amplitude of the equalization produced by an equalization circuit, commonly referred to as the equalization boost amplitude, is calculated as:

$$EQ\ \% = \left(\frac{V_{max}}{V_{min}} - 1\right) * 100 \quad (2)$$

In the case of a one-tap DFE circuit, the equalization boost amplitude may be equal to:

$$EQ\ \% = \left(\frac{V_{in} + C_1}{V_{in} - C_1} - 1\right) * 100 \quad (3)$$

More generally in the case of DFE circuits with n taps, the equalization boost amplitude may be equal to:

$$EQ\ \% = \left(\frac{V_{in} + C_1 + \ldots C_n}{V_{in} - C_1 - \ldots C_n} - 1\right) * 100 \quad (4)$$

For example, the $V_{s1}$ waveform shown in FIG. 2 and produced by a single-tap DFE circuit with a tap coefficient $c_1$=0.25 may have an equalization boost amplitude of $$EQ\ \% = \left(\frac{1 + 0.25}{1 - 0.25} - 1\right) * 100 = 66.7\%$$

for an input amplitude $V_{in}$=1. The $V_{s2}$ waveform produced by a two-tap DFE circuit with two tap coefficients $c_1$=0.25 and $c_2$=0.125 may have an equalization boost amplitude of $$EQ\ \% = \left(\frac{1 + 0.25 + 0.125}{1 - 0.25 - 0.125} - 1\right) * 100 = 120\%$$

for an input amplitude $V_{in}$=1.

The equalization boost amplitude EQ % is a function of both the input voltage amplitude $V_{in}$ and the tap coefficients $c_1$-$c_n$. The equalization boost may be adjusted by choosing appropriate tap coefficients to produce a required boost amplitude. However, because the boost amplitude depends on the input voltage amplitude $V_{in}$, the boost amplitude will vary as $V_{in}$ varies. Changes in transmitter power, in transmission distance or transmission link characteristics, and in receiver gain, as well as other changes affecting the amplitude of the received signal $V_{in}$, may therefore cause the equalization boost amplitude EQ % to vary.

For example, a one-tap DFE circuit receiving an input signal $V_{in}$ with amplitude 1 volt may have its tap coefficient $c_1$ set to $c_1$=0.5 in order to produce an equalization boost amplitude of $$EQ\ \% = \left(\frac{1 + 0.5}{1 - 0.5} - 1\right) * 100 = 200\%.$$

If the input signal amplitude $V_{in}$ drops to 0.75 volts, the equalization boost amplitude may increase to $$EQ\ \% = \left(\frac{0.75 + 0.5}{0.75 - 0.5} - 1\right) * 100 = 400\%.$$

In order to maintain a constant equalization boost amplitude independent of the reduction in input signal amplitude, the tap coefficient $c_1$ would have to be reduced to $c_1$=0.375 in order to maintain the equalization boost amplitude at $$EQ\ \% = \left(\frac{0.75 + 0.375}{0.75 - 0.375} - 1\right) * 100 = 200\%.$$

In order to maintain a constant equalization boost amplitude independently of the amplitude of the input signal amplitude $V_{in}$, it may therefore be desirable to adjust the DFE tap coefficients as a function of the input voltage amplitude. It may further be desirable to automatically adjust the tap coefficients so that a constant boost amplitude can be maintained despite changes in input voltage amplitude. Automatic adjustment may be done without a need for user intervention. Automatic adjustments may allow the equalization circuitry to track variations in the input signal amplitude and immediately adjust the coefficients.

Figure 3:
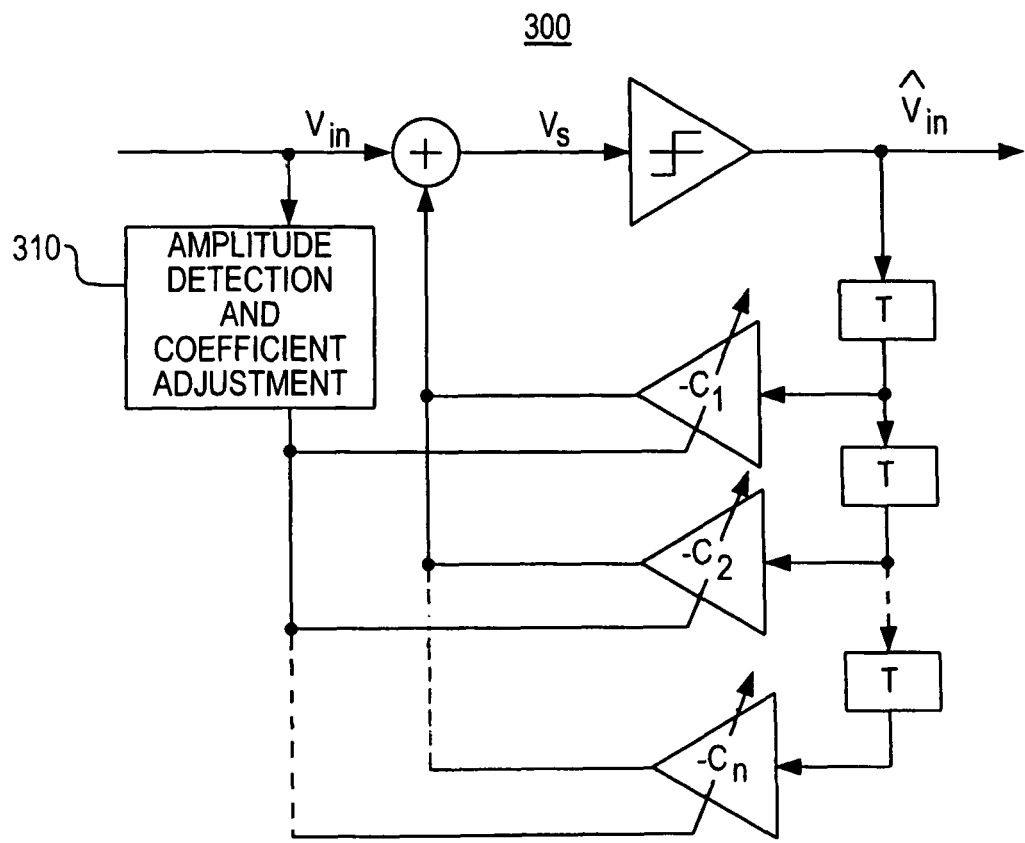
FIG. 3 shows a schematic diagram of a DFE equalizer including amplitude detection and adjustment circuitry.

FIG. 3 shows a schematic diagram of a DFE circuit 300 including amplitude detection and coefficient adjustment circuitry 310 operative to adjust DFE tap coefficients. The amplitude detection and coefficient adjustment circuitry 310 may be used to automatically adjust DFE tap coefficients in order to maintain a constant equalization boost amplitude EQ % despite changes in input voltage amplitude $V_{in}$.

Figure 4A:
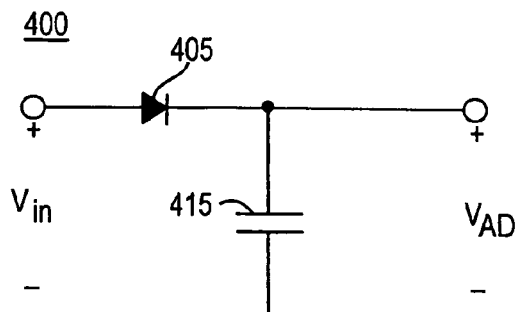
FIGS. 4A and 4B show illustrative signal amplitude detection circuits.
Figure 4B:
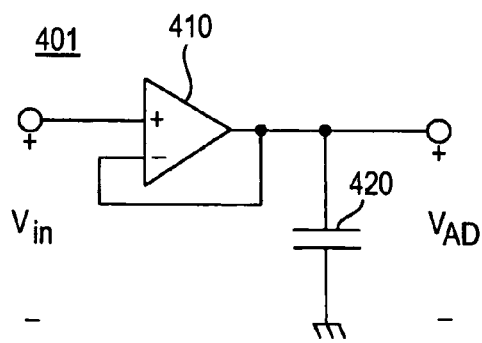

In a preferred embodiment, the amplitude detection circuitry 310 may include an average peak detection circuit used to determine the amplitude of the input signal $V_{in}$. In other embodiments of the invention, amplitude detection circuitry 310 may include peak detection circuitry, signal average measurement circuitry, or other circuitry used to measure characteristics of the input signal $V_{in}$. FIGS. 4A and 4B show illustrative amplitude detection circuits 400 and 401 including rectifiers and low-pass filters. The circuit 400 of FIG. 4A uses a diode 405 as a rectifier, the diode receiving the input signal $V_{in}$ at its input node and producing the amplitude detection signal $V_{AD}$ at its output. The circuit 401 of FIG. 4B uses an op-amp 410 in a unity gain configuration as a rectifier, the op-amp receiving the input signal $V_{in}$ at its non-inverting input and producing the amplitude detection signal $V_{AD}$ at its output. Both circuits use capacitors 415 and 420 coupled between the output voltage node $V_{AD}$ and ground as low-pass filters. Other amplitude detection circuits may also be used in accordance with the principles of the invention.

The amplitude detection and coefficient adjustment circuitry 310 may also include coefficient adjustment circuitry operative to adjust tap coefficients based on the output of the amplitude detection circuitry. The coefficient adjustment circuitry may include one or more multipliers or gain stages operative to produce coefficients proportional or inversely proportional to the input signal amplitude and/or other tap coefficients. The multipliers and gain stages may be operative to produce voltage levels or current levels indicative of the desired tap coefficient value. The coefficient adjustment circuitry may also include signal processing circuitry operative to produce tap coefficients. The signal processing circuitry may include digital processing circuitry operative to compute tap coefficients based on a digital signal indicative of the input signal amplitude.

Methods and circuits for automatic adjustment of equalization may be especially useful in FPGA (field programmable gate array) applications in which the designer of an FPGA equalization circuit may not know what transmitter circuits, transmission links or transmission protocols will be used with the equalization circuit. In applications in which an FPGA is used as a receiver and/or an equalizer, FPGA resources may be used to implement methods for automatic adjustment of equalization in accordance with the principles of the invention. In particular, FPGA analog-to-digital conversion resources and FPGA processing resources may be used to implement automatic equalization adjustments.

Figure 5:
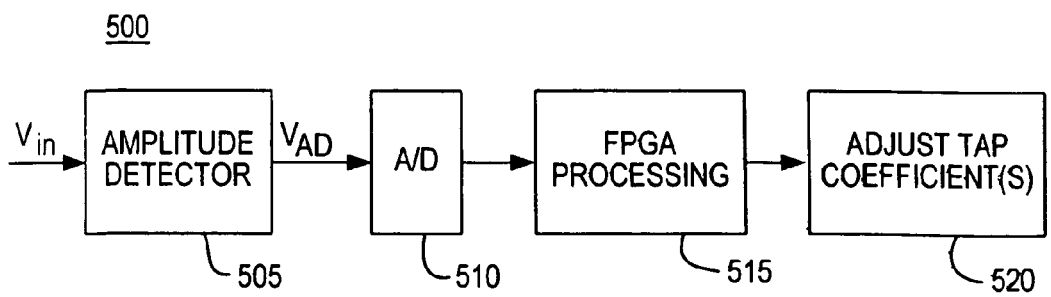
FIG. 5 shows a flow diagram of a process for implementing the invention on an FPGA.

FIG. 5 shows a flow diagram 500 of a process for adjusting tap coefficients of a DFE equalizer to maintain a constant equalization boost amplitude. Flow diagram 500 may be especially useful in FPGA embodiments in which FPGA circuitry may be used for processing and adjustment of the tap coefficients. Flow diagram 500 shows amplitude detector 505 receiving the input signal $V_{in}$ at an input, and producing an amplitude detection signal $V_{AD}$ at an output. The $V_{AD}$ signal may be a signal proportional to the amplitude of $V_{in}$, and may correspond to the output signal from either of the amplitude detection circuits 400 and 401 shown in FIGS. 4A and 4B, for example. In embodiments in which digital processing circuitry is used to adjust the DFE tap coefficients, the $V_{AD}$ signal may be fed into analog-to-digital (A/D) converter 510. A/D converter 510 may produce a digital signal indicative of the amplitude of the input signal. The digital signal may be used by FPGA processing circuitry 505, or other digital processing circuitry, to determine appropriate values for the DFE tap coefficients.

DFE tap coefficient values may depend on the desired values of equalization boost EQ %, on the desired DFE equalizer frequency response, as well as on the input signal voltage amplitude. Once appropriate DFE tap coefficients are determined, the processing circuitry 515 may adjust the tap coefficients 520. Equalization circuitry with adjustable tap coefficients are described in Shumarayev et al. U.S. patent application Ser. No. 11/347,527 filed Feb. 3, 2006, in Tin Lai et al. U.S. patent application Ser. No. 11/238,365 filed Sep. 28, 2005, and in Maangat et al. U.S. patent application Ser. No. 11/182,658 filed Jul. 14, 2005, which are incorporated by reference herein in their entireties.

In single-tap DFE equalizer circuits, the tap coefficient may be calculated as a function of the equalization boost amplitude EQ % and the input voltage amplitude $V_{in}$, and may be equal to:

$$c_1 = \frac{EQ\ \%}{EQ\ \% + 200} * V_{in}.$$

In DFE equalizer circuits with two or more taps, the tap coefficients may be set as a function of the equalization boost amplitude EQ %, the input voltage amplitude $V_{in}$, as well as other factors. In some embodiments, the tap coefficients may be adjusted to obtain the required equalization boost amplitude while maintaining a constant ratio between them, for example. In other embodiments, the tap coefficients may be specified as a percentage of the input voltage amplitude. For example, the tap coefficients may be chosen to be such that $$c_1 + \ldots + c_n = \frac{EQ\ \%}{EQ\ \% + 200} * V_{in},$$

with additional constraints such as $$\frac{c_n}{c_{n+1}} = \text{constant}$$

for all coefficients $c_n$. The tap coefficients may alternatively be chosen such that $$c_n = \alpha_n * \frac{EQ\ \%}{EQ\ \% + 200} * V_{in}$$

where $\alpha_n$ is a constant.

Figure 6:
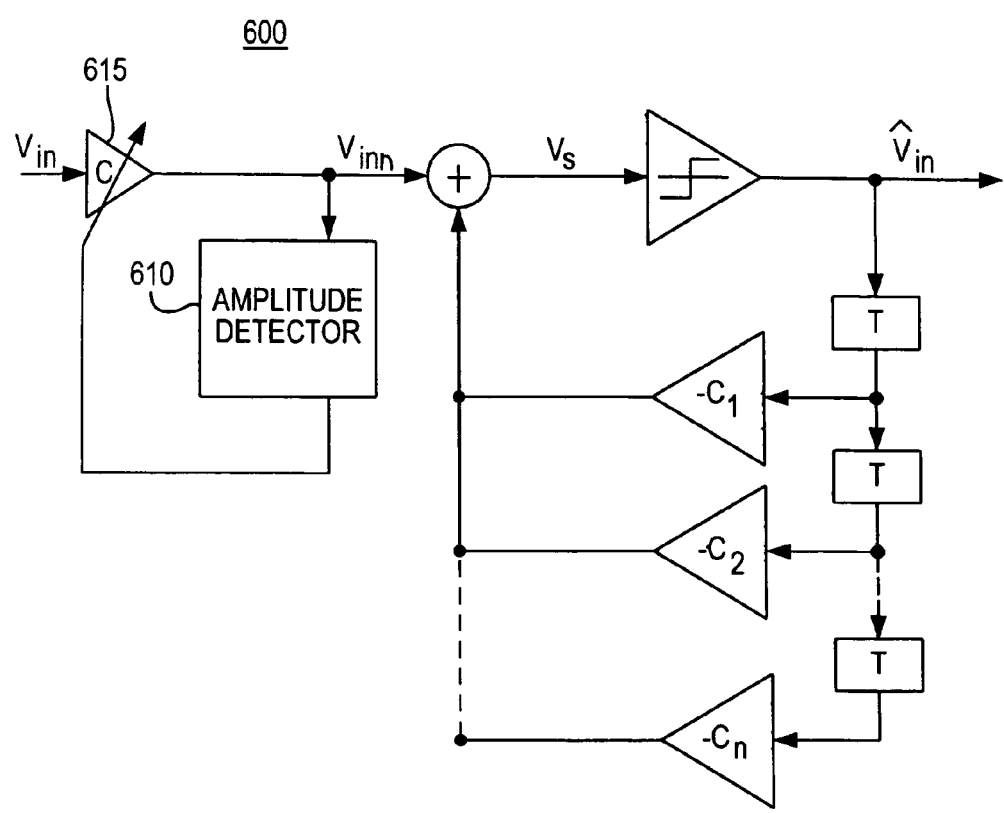
FIG. 6 shows a schematic diagram of a DFE equalizer including amplitude detection and adjustment circuitry.

FIG. 6 shows a schematic diagram of a DFE circuit 600 operative to automatically normalize the input voltage amplitude $V_{in}$ in order to maintain a constant equalization boost amplitude EQ % despite changes in input voltage amplitude. DFE equalizer 600 includes amplitude detector 610 used to measure the amplitude of the input voltage signal. Amplitude detector circuit 610 may be used to adjust the gain of input signal amplifier 615 in order to produce a normalized version $V_{inn}$ of the input signal $V_{in}$. The signal $V_{inn}$ may be proportional to the input signal at each instant in time, and may have a constant amplitude at all times. DFE circuit 600 may maintain a constant equalization boost amplitude EQ % despite variations in the input signal amplitude.

Methods and circuits for the automatic adjustment of equalization are described herein. One skilled in the art will appreciate that the invention can be practiced by other than the described embodiments, which are presented for purposes of illustration and not of limitation. The invention is limited only by the claims which follow.

The invention claimed is:

1. An equalizer to produce an output signal from an input signal, the equalizer comprising:

a quantizer receiving at its input a signal corresponding to a weighted sum of the input signal and at least one delayed version of the output signal, the quantizer producing the output signal; and circuitry receiving at its input a control signal indicating variations in amplitude of the input signal, the circuitry adjusting at least one coefficient of the weighted sum in proportion to the variations in the amplitude of the input signal in response to the control signal, wherein the control signal is generated by peak detection circuitry, and wherein the input signal is normalized based on the control signal.

2. The equalizer of claim 1, further comprising:
an amplitude detector to produce the control signal indicative of the amplitude of the input signal;
wherein the circuitry to adjust at least one coefficient adjusts at least one coefficient of the weighted sum in response to changes in the control signal of the amplitude detector.

3. The equalizer of claim 1, wherein the circuitry to adjust at least one coefficient adjusts at least one coefficient of the weighted sum in order to maintain a substantially constant equalization boost amplitude.

4. The equalizer of claim 1, wherein the weighted sum comprises a weighted sum of the input signal and at least two delayed versions of the output signal, and wherein the circuitry to adjust at least one coefficient of the weighted sum maintains a constant ratio between the coefficients corresponding to the at least two delayed versions of the output signal.

5. The equalizer of claim 1, wherein the quantizer is a continuous-time quantizer.

6. The equalizer of claim 1 wherein the quantizer is a discrete-time quantizer.

7. An FPGA circuit comprising the equalizer of claim 1.

8. An integrated circuit comprising the equalizer of claim 1.

9. A method for providing equalization using an equalizer with at least one tap coefficient, the method comprising:
receiving an equalization input signal;
producing an output signal based on the weighted sum of the input signal and at least one delayed version of the output signal;
receiving, using circuitry, a control signal indicating variations in amplitude of the input signal; and
adjusting, using the circuitry, at least one coefficient of the weighted sum in proportion to the variations in the amplitude of the input signal in response to the control signal, wherein the control signal is generated by peak detection circuitry, and wherein the input signal is normalized based on the control signal.

10. The method of claim 9, wherein the producing an output signal comprises producing a quantized output signal.

11. The method of claim 9, wherein the producing an output signal comprises producing an output signal based on the weighted sum of the input signal and at least two delayed versions of the output signal, and wherein the adjusting comprises maintaining a constant ratio between the coefficients of the weighted sum corresponding to the delayed versions of the output signal.

12. The method of claim 9, wherein the output signal is a continuous-time signal.

13. The method of claim 9, wherein the output signal is a discrete-time signal.

14. The method of claim 9, wherein said method for providing equalization is used in a field programmable gate array.

15. A field programmable gate array comprising:
adjustable equalization circuitry to receive an equalization input signal and to produce an equalization output signal, the output signal being produced as a function of the input signal and at least one adjustable tap coefficient; and
circuitry operable to:
receive at its input a control signal indicating variations in amplitude of the equalization input signal; and
adjust at least one tap coefficient of the equalization circuitry in proportion to the variations in the amplitude of the input signal in response to the control signal, wherein the control signal is generated by peak detection circuitry, and wherein the input signal is normalized based on the control signal.

16. The field programmable gate array of claim 15, further comprising:
processing circuitry to compute at least one tap coefficient based on the amplitude of the input signal;
wherein the circuitry to adjust at least one tap coefficient adjusts at least one tap coefficient in response to the processing circuitry computing the at least one tap coefficient value.

17. The field programmable gate array of claim 16, wherein the processing circuitry comprises digital processing circuitry.

18. The equalizer of claim 1, further comprising:
adjustable tap coefficient circuitry comprising the at least one coefficient, wherein the adjustable tap coefficient circuitry is operative to produce the weighted sum of the input signal; and
an amplitude detector operative to produce the control signal indicative of the amplitude of the input signal;
wherein the adjustable tap coefficient circuitry is coupled to the output signal of the quantizer and the control signal of the amplitude detector, and wherein the at least one coefficient of the adjustable tap coefficient circuitry is adjusted in response to changes in the control signal of the amplitude detector.

19. The method of claim 9 further comprising:
receiving, at a tap coefficient circuitry that includes the at least one coefficient, a quantized signal and the control signal indicative of the amplitude of the input signal;
wherein the tap coefficient circuitry is operative to produce the weighted sum of the input signal, and the at least one coefficient of the adjustable tap coefficient circuitry is adjusted in response to changes in the control signal.

20. The equalizer of claim 1, wherein the peak detection circuitry comprises low pass filter circuitry.

21. The equalizer of claim 1, wherein the peak detection circuitry comprises:
a diode comprising an output and an input, wherein the input of the diode is coupled to the input signal and the output of the diode provides the control signal to the circuitry; and
a capacitor coupled to the output of the diode.

22. The equalizer of claim 1, wherein the peak detection circuitry comprises:
an amplifier comprising first and second inputs and an output that provides the control signal to the circuitry, wherein the first input is coupled to receive the input signal and the second input is coupled to the output of the amplifier; and
a capacitor coupled to the output of the amplifier.

\* \* \* \* \*